US010529645B2

(12) United States Patent
Gandhi et al.

(10) Patent No.: US 10,529,645 B2
(45) Date of Patent: Jan. 7, 2020

(54) METHODS AND APPARATUS FOR THERMAL INTERFACE MATERIAL (TIM) BOND LINE THICKNESS (BLT) REDUCTION AND TIM ADHESION ENHANCEMENT FOR EFFICIENT THERMAL MANAGEMENT

(71) Applicant: Xilinx, Inc., San Jose, CA (US)

(72) Inventors: Jaspreet Singh Gandhi, San Jose, CA (US); Henley Liu, San Jose, CA (US); Tien-Yu Lee, San Jose, CA (US); Gamal Refai-Ahmed, Santa Clara, CA (US); Myongseob Kim, Pleasanton, CA (US); Ferdinand F. Fernandez, San Jose, CA (US); Ivor G. Barber, Los Gatos, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/617,774

(22) Filed: Jun. 8, 2017

(65) Prior Publication Data

US 2018/0358280 A1 Dec. 13, 2018

(51) Int. Cl.
*H01L 23/367* (2006.01)
*H01L 23/10* (2006.01)
(Continued)

(52) U.S. Cl.
CPC ...... *H01L 23/3675* (2013.01); *H01L 21/4817* (2013.01); *H01L 23/055* (2013.01); *H01L 23/10* (2013.01); *H01L 24/16* (2013.01); *H01L 24/29* (2013.01); *H01L 24/32* (2013.01); *H01L 24/73* (2013.01); *H01L 25/0655* (2013.01); *H01L 25/50* (2013.01); *H01L 21/565* (2013.01); *H01L 23/3672* (2013.01); *H01L 23/49816* (2013.01); *H01L 23/49827* (2013.01); *H01L 2224/16235* (2013.01); *H01L 2224/29022* (2013.01); *H01L 2224/32245* (2013.01); *H01L 2224/73253* (2013.01); *H01L 2924/1631* (2013.01);
(Continued)

(58) Field of Classification Search
None
See application file for complete search history.

(56) References Cited

U.S. PATENT DOCUMENTS 8,901,732 B2 * 12/2014 Yew ..................... H01L 23/4334
257/706
9,673,119 B2 * 6/2017 Lin ......................... H01L 23/10
(Continued)

OTHER PUBLICATIONS

U.S. Appl. No. 15/369,607, filed Dec. 5, 2016, Refai-Ahmed et al.

*Primary Examiner* — Long Pham
(74) *Attorney, Agent, or Firm* — Steven Roberts

(57) ABSTRACT

Methods and apparatus are described for heat management in an integrated circuit (IC) package using a lid with recessed areas in the inner surfaces of the lid. The recessed areas (e.g., trenches) provide receptacles for accepting a portion of a thermal interface material (TIM) that may be forced out when the lid is positioned on the TIM above one or more integrated circuit (IC) dies during fabrication of the IC package. In this manner, the TIM bond line thickness (BLT) between the lid and the IC die(s) may be reduced for decreased thermal resistance, but sufficient interfacial adhesion is provided for the IC package with such a lid to avoid TIM delamination.

20 Claims, 11 Drawing Sheets

(51) Int. Cl.
*H01L 23/055* (2006.01)
*H01L 25/00* (2006.01)
*H01L 25/065* (2006.01)
*H01L 21/48* (2006.01)
*H01L 23/00* (2006.01)
*H01L 21/56* (2006.01)
*H01L 23/498* (2006.01)

(52) U.S. Cl.
CPC ............... *H01L 2924/1632* (2013.01); *H01L 2924/16153* (2013.01); *H01L 2924/16195* (2013.01); *H01L 2924/16196* (2013.01); *H01L 2924/16235* (2013.01); *H01L 2924/1816* (2013.01)

(56) References Cited

U.S. PATENT DOCUMENTS

| | | | |
|---|---|---|---|
| 2008/0299704 A1* | 12/2008 | Ronen | H01L 23/50 438/107 |
| 2010/0096747 A1* | 4/2010 | Kusano | H01L 21/565 257/706 |
| 2012/0074589 A1 | 3/2012 | Mardi et al. | |
| 2014/0268342 A1* | 9/2014 | Matsushita | G01J 3/0229 359/578 |
| 2015/0187679 A1* | 7/2015 | Ho | H01L 21/4803 257/690 |
| 2017/0092619 A1 | 3/2017 | Refai-Ahmed et al. | |

* cited by examiner

METHODS AND APPARATUS FOR THERMAL INTERFACE MATERIAL (TIM) BOND LINE THICKNESS (BLT) REDUCTION AND TIM ADHESION ENHANCEMENT FOR EFFICIENT THERMAL MANAGEMENT

TECHNICAL FIELD

Examples of the present disclosure generally relate to integrated circuit packaging and, more particularly, to integrated circuit packaging techniques and apparatus to promote reduced thermal interface material (TIM) bond line thickness (BLT) and/or increased TIM adhesion, for improved thermal management.

BACKGROUND

Electronic devices (e.g., computers, laptops, tablets, copiers, digital cameras, smart phones, and the like) often employ integrated circuits (ICs, also known as "chips"). These integrated circuits are typically implemented as semiconductor dies packaged in integrated circuit packages. The semiconductor dies may include memory, logic, and/or any of various other suitable circuit types.

Many integrated circuits and other semiconductor devices utilize an arrangement of bumps, such as a ball grid array (BGA) or a flip chip ball grid array (FCBGA), for surface mounting packages to a circuit board (e.g., printed circuit board (PCB). Any of various suitable package pin structures, such as controlled collapse chip connection (C4) bumps or microbumps (as used in stacked silicon interconnect (SSI) applications), may be used to conduct electrical signals between a channel on an integrated circuit (IC) die (or other package device) and the circuit board on which the package is mounted.

As the density of active components in IC dies continues to rise, the IC dies produce an ever-increasing amount of heat during operation. This heat is typically thermally conducted from the IC dies through a thermal interface material (TIM) to a lid and then to a heat sink to facilitate heat dissipation away from the IC dies. Heat spreaders (e.g., vapor chambers) may be used to spread heat from a concentrated heat source such as an IC die to a larger heat sink.

SUMMARY

One example of the present disclosure is a lid for an integrated circuit (IC) package. The lid generally includes an outer surface, a first inner surface, and one or more second inner surfaces recessed from the first inner surface to form one or more indentations in the lid.

Another example of the present disclosure is an IC package. The IC package generally includes a package substrate, one or more IC dies disposed above the package substrate, a thermal interface material (TIM) disposed above the IC dies, and a lid disposed above the TIM. The lid generally includes an outer surface, a first inner surface, and one or more second inner surfaces recessed from the first inner surface to form one or more indentations in the lid.

Yet another example of the present disclosure is a method of fabricating an IC package. The method generally includes disposing one or more IC dies above a package substrate; disposing a TIM above the one or more IC dies; and disposing a lid above the TIM, wherein the lid comprises one or more indentations and wherein disposing the lid above the TIM comprises forcing out a portion of the TIM into the one or more indentations.

Yet another example of the present disclosure is an IC package. The IC package generally includes a package substrate, one or more IC dies disposed above the package substrate, a molding encapsulating at least a portion of the one or more IC dies, a thermal interface material (TIM) disposed above the IC dies, and a lid disposed above the TIM, wherein at least one of the molding or at least one surface of the one or more IC dies comprises one or more indentations therein.

Yet another example of the present disclosure is a method of fabricating an IC package. The method generally includes disposing one or more IC dies above a package substrate; disposing a molding for encapsulating at least a portion of the one or more IC dies; disposing a TIM above the one or more IC dies; and disposing a lid above the TIM, wherein at least one of the molding or at least one surface of the one or more IC dies comprises one or more indentations therein and wherein disposing the lid above the TIM comprises forcing a portion of the TIM into the one or more indentations.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

To facilitate understanding, identical reference numerals have been used, where possible, to designate identical elements that are common to the figures. It is contemplated that elements of one example may be beneficially incorporated in other examples.

DETAILED DESCRIPTION

Examples of the present disclosure provide apparatus and techniques for heat management using a lid with recessed areas in the inner surfaces of the lid. The recessed areas provide receptacles for accepting a portion of a thermal interface material (TIM) that may be forced out when the lid is positioned on the TIM above one or more integrated circuit (IC) dies in an IC package during manufacturing. In this manner, the TIM bond line thickness (BLT) between the lid and the IC die(s) may be reduced for decreased thermal resistance, but sufficient interfacial adhesion is provided for the IC package with such a lid in an effort to avoid TIM delamination.

Example Integrated Circuit Packages

Figure 1A:
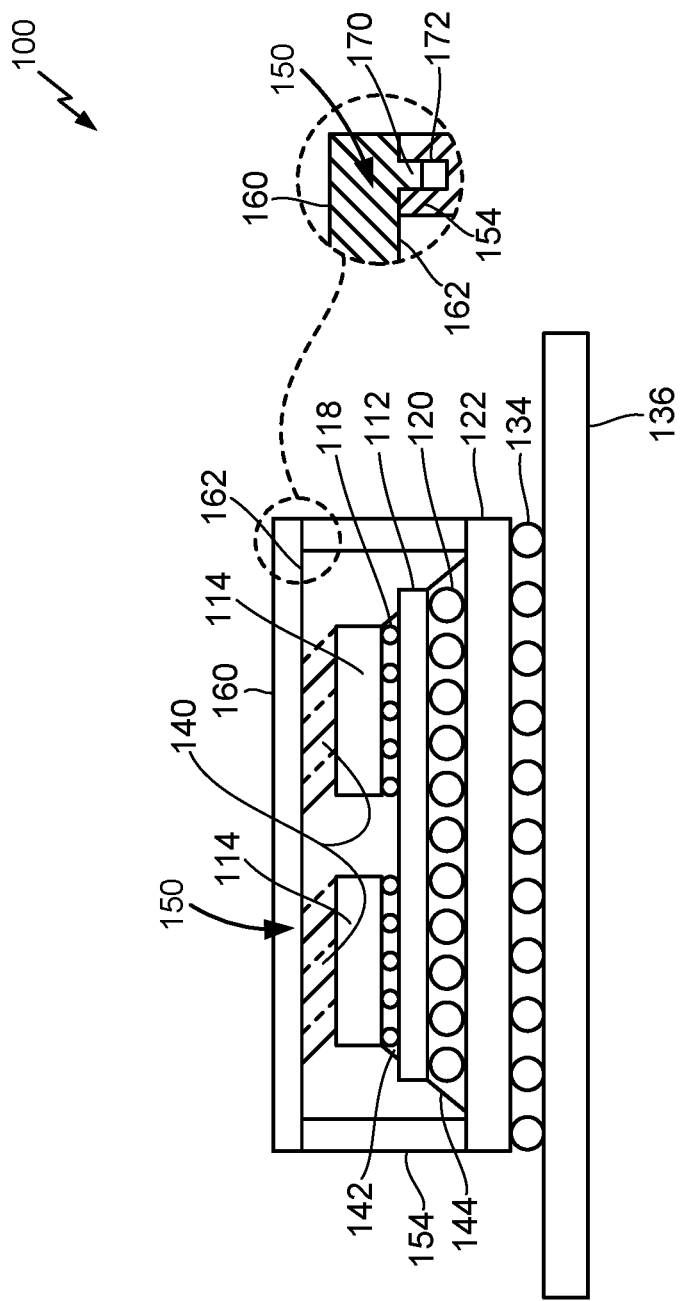
FIG. 1A is a cross-sectional view of an example integrated circuit (IC) package including one or more IC dies covered by a lid, in accordance with an example of the present disclosure.

Turning to FIG. 1A, an example integrated circuit (IC) package 100 is illustrated. The IC package 100 includes one or more IC dies 114 (also referred to as "chips") connected optionally by an interposer 112 to a package substrate 122. Although two IC dies 114 are shown in FIG. 1A, the number of IC dies may range from one to as many as can be fit within the IC package 100.

The interposer 112 includes circuitry for electrically connecting the IC dies 114 to circuitry of the package substrate 122. The interposer 112 may be passive and contain interconnects (not shown) for connecting one of the IC dies 114 to another and/or through-silicon vias (TSVs) for connecting each of the IC dies to the package substrate 122. For other examples, the interposer 112 may be active and include transistors. Package bumps 120, also known as "controlled collapse chip connection (C4) bumps," are utilized to provide an electrical connection between the circuitry of the interposer 112 and the circuitry of the package substrate 122. The package substrate 122 may be mounted and connected to a printed circuit board (PCB) 136, utilizing solder balls 134, wire bonding, or any other suitable technique. For some examples, an undermolding 144 may be utilized to fill the space not taken by the package bumps 120 between the package substrate 122 and the interposer 112, thereby providing structural rigidity to the IC package 100.

The IC dies 114 are mounted to one or more surfaces of the interposer 112, or alternatively in examples wherein an interposer is not utilized, to the package substrate 122. The IC dies 114 may be programmable logic devices (e.g., field programmable gate arrays (FPGAs)), memory devices, optical devices, processors, or other IC structures. Optical devices include photodetectors, lasers, optical sources, and the like. In the example depicted in FIG. 1A, the IC dies 114 are mounted to a top surface of the interposer 112 by a plurality of microbumps 118. The microbumps 118 electrically connect the circuitry of each IC die 114 to circuitry of the interposer 112. The circuitry of the interposer 112 connects the microbumps 118 to selective package bumps 120, and hence, connects selective circuitry of each IC die 114 to the package substrate 122, to enable communication of the IC dies 114 with the PCB 136, for example, after the IC package 100 is mounted within an electronic device (not shown). When the optional interposer 112 is not present, the microbumps 118 may connect selective circuitry of each IC die 114 to the package substrate 122 to enable communication of the IC dies 114 with the PCB 136. For some examples, an undermolding 142 may be utilized to fill the space not taken by the microbumps 118 between the IC dies 114 and interposer 112 to provide structural rigidity to the IC package 100.

The IC package 100 may additionally include a stiffener 154. The stiffener 154 may be coupled to the package substrate 122 and circumscribe the IC dies 114. The stiffener 154 can extend to peripheral edges of the package substrate 122 to provide mechanical support, which helps prevent the IC package 100 from bowing and warpage. The stiffener 154 may be a single-layer structure or a multi-layer structure. The stiffener 154 may be made of ceramic, metal, or other various inorganic materials, such as aluminum oxide ($Al_2O_3$), aluminum nitride (AlN), silicon nitride (SiN), silicon (Si), copper (Cu), aluminum (Al), diamond, and stainless steel, among other materials. The stiffener 154 can also be made of organic materials such as copper-clad laminate.

A lid 150 may be disposed over the IC dies 114. In some examples, the lid 150 may be fabricated from a plastic material or other suitable material. In other examples, particularly where it is desirable to utilize the lid 150 to receive and convey heat away from the IC dies 114, the lid 150 may be fabricated from a thermally conductive material, such as copper, nickel-plated copper, or aluminum, among other suitable materials. The lid 150 may have a thickness of between about 0.5 mm and about 3.0 mm, although other thicknesses may be utilized.

The lid 150 has a top surface 160 and a bottom surface 162. For some examples, the top surface 160 forms the exterior top surface of the IC package 100. The bottom surface 162 faces the IC dies 114. A heat sink (not shown in FIG. 1A) may optionally be mounted to the top surface 160 of the lid 150.

Generally, the lid 150 is disposed over the IC dies 114. A thermal interface material (TIM) 140 may be utilized to thermally and/or mechanically couple the lid 150 to the IC dies 114. The TIM 140 may be applied between two surfaces, either metal-to-metal or metal-to-semiconductor (e.g., silicon). The TIM 140 may be selected to provide a thermally conductive path between the lid 150 to the IC dies 114 so that heat generated by the IC dies 114 may be dissipated through the lid 150. The TIM 140 is generally a heat transfer material having a conductivity of at least about 0.1 W/m·K and is designed to displace the air that is present in the gaps between the lid 150 and the IC dies 114, thereby decreasing the thermal contact resistance. Examples of materials suitable for use as the TIM 140 include thermal grease, thermally conductive epoxy, phase-change materials (PCMs), conductive tapes, and silicone-coated fabrics among other suitable materials. The TIM 140 may be a soft or compliant adhesive to allow compensation between mismatched heights of neighboring IC dies 114 within the IC package 100. In one example, the TIM 140 may be a thermal gel or thermal epoxy, such as packaging component attach adhesives available from Al Technology, Inc., located in Princeton Junction, N.J. In other examples, the TIM 140 may include organic materials, such as a thermal grease (e.g., G750 from Shin-Etsu Chemical Co., Ltd. of Tokyo, Japan) or a thermal phase-change material, such as Tpcm 780 or Tpcm 780SP available from Laird PLC of London, United Kingdom, which can be used as a preform or paste).

The lid 150 may also be disposed over the stiffener 154. In some implementations, the lid 150 may be bonded to the stiffener 154 by an adhesive (not shown), such as an epoxy.

In other implementations, the lid 150 is located relative to the stiffener 154 by a pin 170. The pin 170 may be attached to only one of the lid 150 and the stiffener 154, so that the lid 150 and stiffener are mechanically decoupled. This mechanical decoupling allows the lid 150 to move freely (i.e., "float") relative to the stiffener 154. In this manner, stresses between the lid 150 and the stiffener 154 are mechanically decoupled, resulting in less warpage and delamination of the various layers and components of the IC package 100.

In the example depicted in FIG. 1A, the pin 170 is attached to the lid 150. For example, the pin 170 may be bonded, screwed in, force fit, or otherwise attached to the lid 150. The pin 170 may extend from the bottom surface 162 of the lid 150 into a clearance hole 172 formed in a top of the stiffener 154 to allow the lid 150 to move relative to the stiffener 154. In some implementations, the pin 170 is an integral part of the lid 150. For example, the pin 170 may be formed by stamping the lid 150 to project the pin 170 from the bottom surface 162 of the lid 150. In another example, the pin 170 may be a projection formed during 3D printing of the lid 150.

Figure 1B:
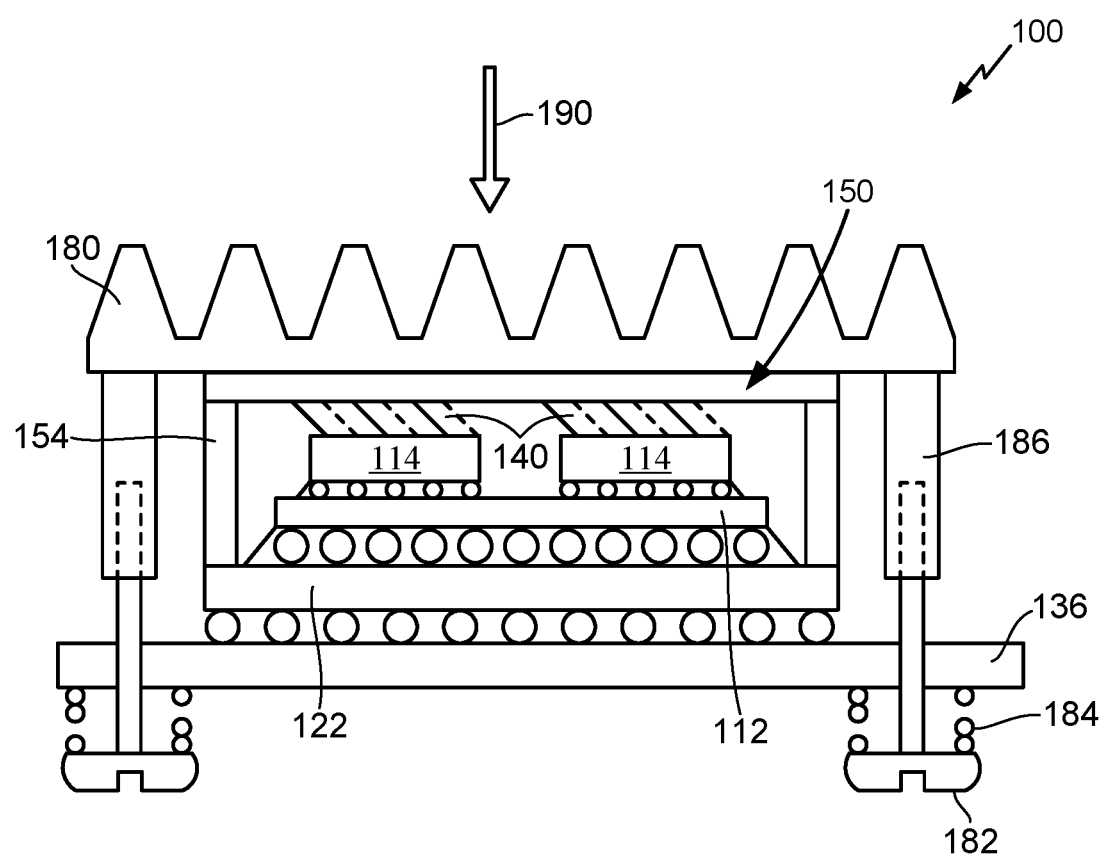
FIG. 1B is a cross-sectional view of the IC package of FIG. 1A with a heat sink mounted to a printed circuit board, in accordance with an example of the present disclosure.

FIG. 1B is a cross-sectional view of the IC package 100 of FIG. 1A with a heat sink assembly 180 mounted to the printed circuit board 136. The heat sink assembly 180 is coupled to the printed circuit board 136 in a manner that secures the lid 150 to the stiffener 154. In some implementations, a fastener 182 may be threadingly engaged with posts 186 of the heat sink assembly 180 so that the heat sink assembly exerts a force on the lid 150 in a direction of the dies 114, as illustrated by arrow 190. Optionally, a spring 184 or other resilient object may be disposed between the fastener 182 and the printed circuit board 136 to provide force that the heat sink assembly 180 exerts on the lid 150. Advantageously, the force provided by the heat sink assembly 180 allows the lid 150 to maintain good thermal contact with the dies 114, while remaining floating on the stiffener 154.

Example Lid Designs Permitting Reduced TIM BLT

The thermal interface material (TIM) bond line thickness (BLT) plays a significant role in IC package thermal management for advanced high power applications. To improve heat dissipation from the IC die(s) in the IC package, it is desirable to decrease thermal resistance and increase thermal conductivity, as described above. The TIM may be used to thermally couple the IC die(s) to the lid, where smaller TIM BLT may be preferred for lower thermal resistance. Lower BLT may have a significant impact on decreasing junction temperature due to faster heat transfer. However, TIM BLT reduction may be limited by several factors, such as the maximum filler size, interfacial adhesion strength, topology absorption, and warpage compensation. If these factors are not taken into account in design and process development, TIM delamination can occur. TIM delamination can create voids with air (or potentially other gases) to be trapped therein, which reduce the thermal conductivity between the IC die(s) and the lid.

Examples of the present disclosure provide a lid with recessed areas in the inner surfaces of the lid. The recessed areas provide receptacles for accepting a portion of the TIM that may be laterally squeezed out when the lid is positioned on the TIM above the IC die(s). In this manner, TIM BLT reduction can be achieved between the lid and the IC die(s), but suitable interfacial adhesion is provided for the IC package with such a lid. Accordingly, the lid design can provide lower thermal resistance, increased thermal conductivity, and increased heat transfer from the IC die(s) to the lid.

Figure 2:
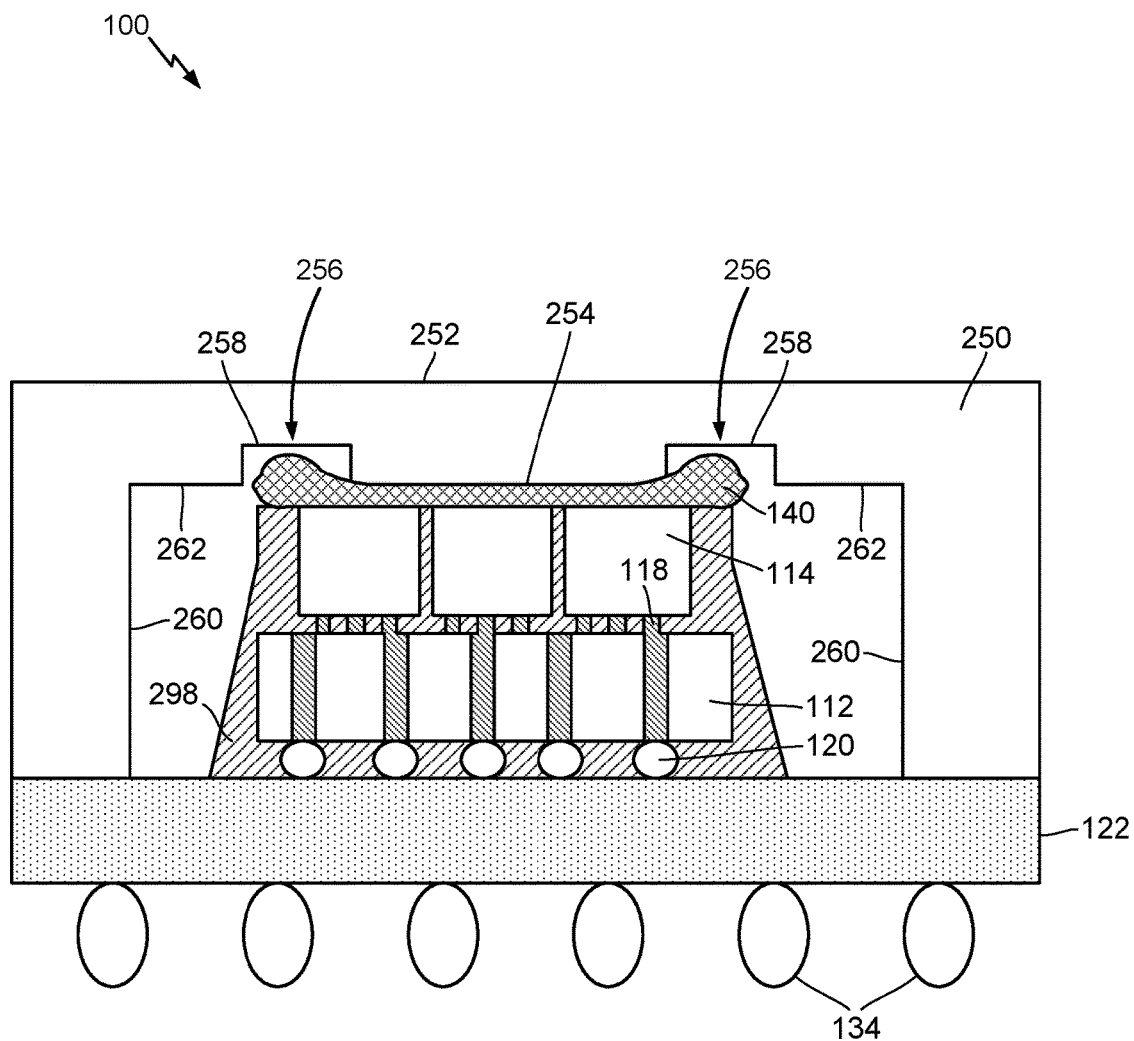
FIG. 2 is a cross-sectional view of an example IC package including a lid having recessed areas at IC die corners to accept a thermal interface material (TIM), in accordance with an example of the present disclosure.

FIG. 2 is a cross-sectional view of another example IC package 100 with a differently shaped lid 250, in accordance with an example of the present disclosure. The lid 250 has an outer surface 252 and a first inner surface 254 on a side opposing the outer surface. The lid 250 includes one or more recessed areas 256, which are recessed with respect to the first inner surface 254 from the perspective of a bottom view of the lid. The recessed areas 256 may also be referred to by any of various other suitable names, such as indentations or trenches. The recessed areas 256 are intended to receive a portion of the TIM 140 that is forced out (e.g., squeezed out) from above the IC die(s) when the lid 250 is positioned above the TIM. In this manner, the bond line thickness (BLT) of the TIM 140 in the area between the first inner surface 254 and the IC die(s) can be reduced, compared to a lid design without one or more recessed areas. The reduced TIM BLT in this area provides comparatively lower thermal resistance, which improves heat dissipation of the IC die(s) 114 in the IC package 100. Because the recessed areas 256 take in the "excess" portion of the TIM 140 (as illustrated by the bulbous portions of the TIM 140 in FIG. 2), the TIM is thicker (i.e., the TIM BLT is greater) in these areas and can still maintain adequate adhesion between the lid 250 and the IC die(s) 114 for the IC package 100.

The lid 250 may also include one or more third inner surfaces 260. For example, for a rectangular, square, or other quadrilateral lid, the lid 250 may include four third inner surfaces 260. For some examples, one or more of the third inner surfaces 260 may be perpendicular to the first inner surface 254. For other examples, one or more of the third inner surfaces 260 may be flared or otherwise angled with respect to the first inner surface 254 (e.g., have an angle different than 90°).

For some examples, the lid 250 may also include one or more fourth inner surfaces 262, as illustrated in FIG. 2. The fourth inner surfaces 262 of the lid 250 may connect the recessed areas 256 (e.g., the second inner surfaces 258) with the third inner surfaces 260. In FIG. 2, the four inner surfaces 262 of the lid 250 are horizontal and parallel with the first inner surface 254.

For some examples as shown in FIG. 2, the IC package 100 may include a molding 298 (also referred to as an encapsulation material or mold compound). The molding 298 may comprise any of various suitable substances (e.g., resin) for encapsulating and protecting at least a portion of the IC dies 114 and/or other parts of the IC package 100.

Figure 2A:
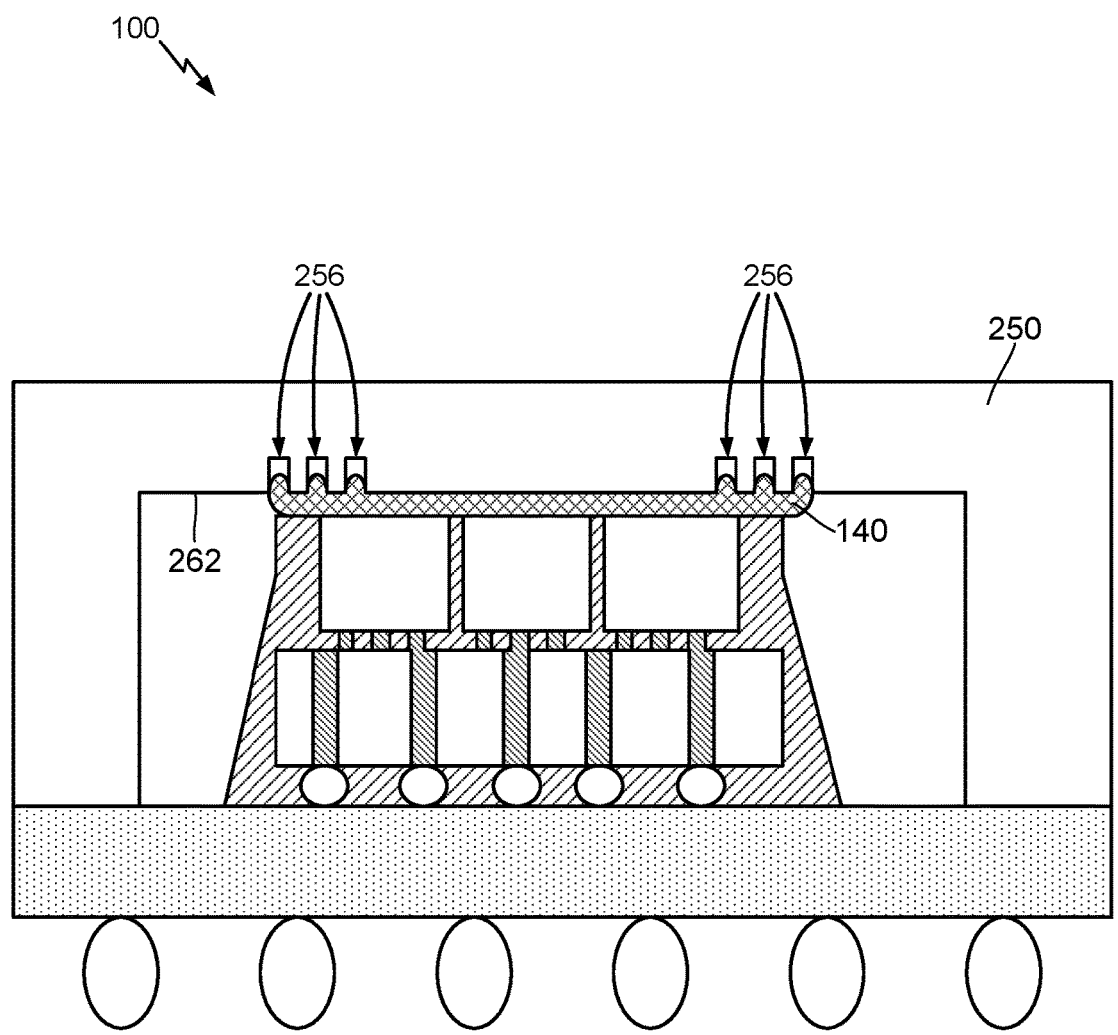
FIG. 2A is a cross-sectional view of an example IC package including a lid having multiple recesses at each of multiple locations, in accordance with an example of the present disclosure.

FIG. 2A is a cross-sectional view of another example lid 250 having multiple recessed areas 256 (e.g., trenches) at each of multiple locations, in accordance with an example of the present disclosure. The multiple recessed areas 256 may be deeper than a single recessed area having a similar width. For some examples, the lid 250 may include a combination of one and more than one recessed areas 256, where one or more locations have one recessed area and one or more other locations have multiple recessed areas. The multiple recessed areas 256 may serve to capture the TIM 140 and prevent excessive TIM squeeze-out when the lid 250 is placed on the TIM.

Figure 3A:
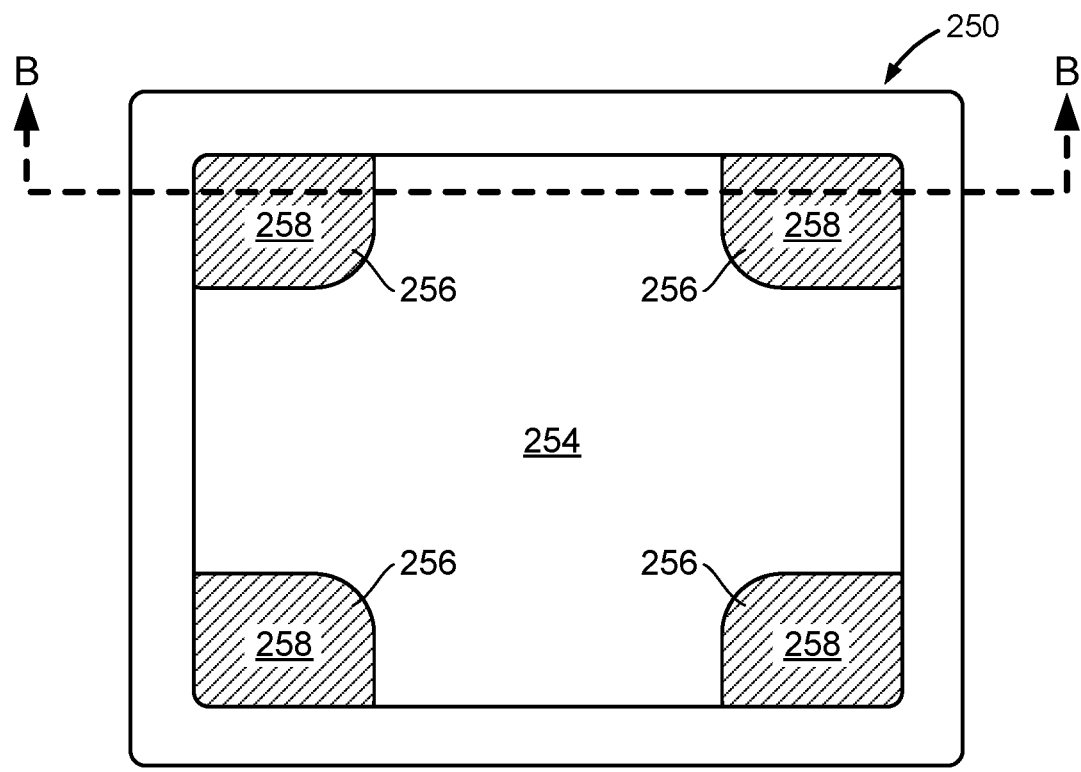
FIG. 3A is a bottom view of an example lid with recessed areas, in accordance with an example of the present disclosure.
Figure 3B:
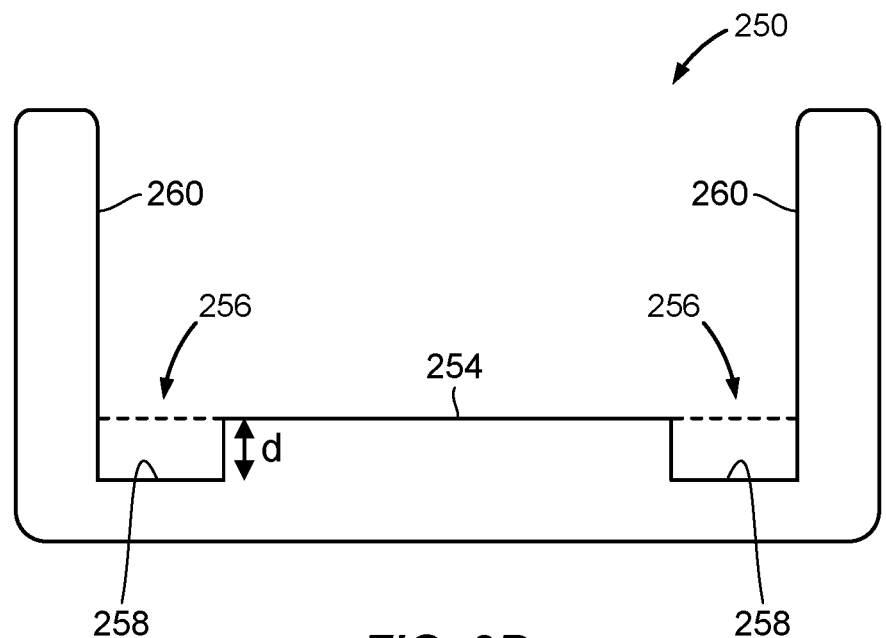
FIG. 3B is a cross-sectional view of the example lid of FIG. 3A through line segment BB, in accordance with an example of the present disclosure.

FIG. 3A is a bottom view of another example lid 250 with recessed areas 256, in accordance with an example of the present disclosure. FIG. 3B is a cross-sectional view of the example lid 250 of FIG. 3A through line segment BB, in accordance with an example of the present disclosure. The lid 250 may comprise any of various suitable materials for heat dissipation, such as metal (e.g., nickel-plated copper, stainless steel, titanium, or aluminum silicon carbide (AlSiC)). The lid 250 may be formed using any of various suitable techniques. In the case of a metal lid, a sheet of metal may be shaped into the lid 250 by forging, and in some cases, may be subsequently electroplated.

In FIG. 3A, four recessed areas 256 are illustrated as an example, although the lid 250 may have more or less than four recessed areas. The radius of curvature for each of the recessed areas 256 may be about 2 to 3 mm, for example. Each of the recessed areas 256 may have a depth d in a range of about 40 to 50 μm, for example, with respect to the first inner surface 254, as illustrated in FIG. 3B. The recessed areas 256 may have the shape illustrated in FIG. 3A, for example. For other examples, the shape of the recessed areas 256 may be any of various suitable shapes, such as circular, oval, quadrilateral (e.g., square or rectangular), triangular, or other polygonal (e.g., hexagonal or octagonal).

In the lid 250 of FIG. 3A, the four recessed areas 256 are arranged in the lid such that these areas will be located above four different corners of the IC die(s) 114 in the IC package 100. In this manner, when the lid 250 is placed above the IC die(s) 114, a portion of the TIM 140 may be squeezed out from the region between the first inner surface 254 and the upper surface(s) of the IC die(s) and may be received by the recessed areas 256. Therefore, the recessed areas 256 may maintain thicker standoff with a wider footprint of the TIM 140, thereby increasing adhesion between the lid 250 and the IC die(s) 114.

Figure 4A:
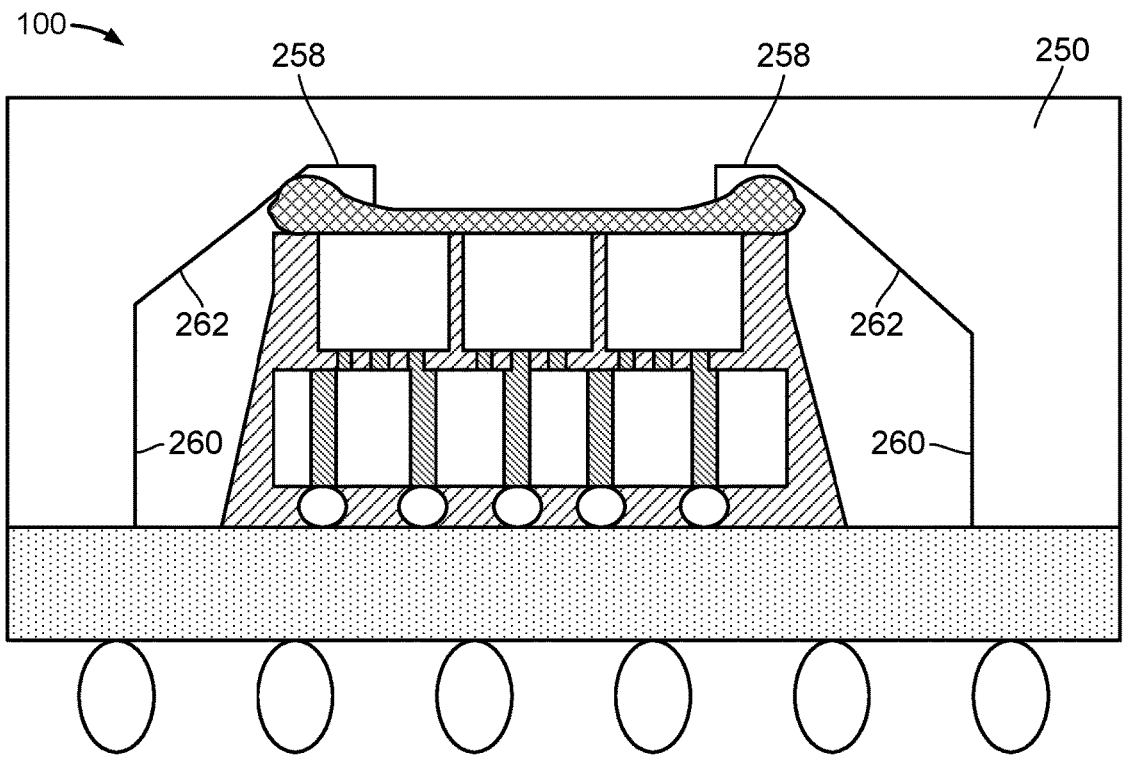
FIGS. 4A, 4B, and 4C illustrate the IC package of FIG. 2 with the recessed areas at IC die corners having chamfered, curved, and step profiles, respectively, in accordance with an example of the present disclosure.
Figure 4B:
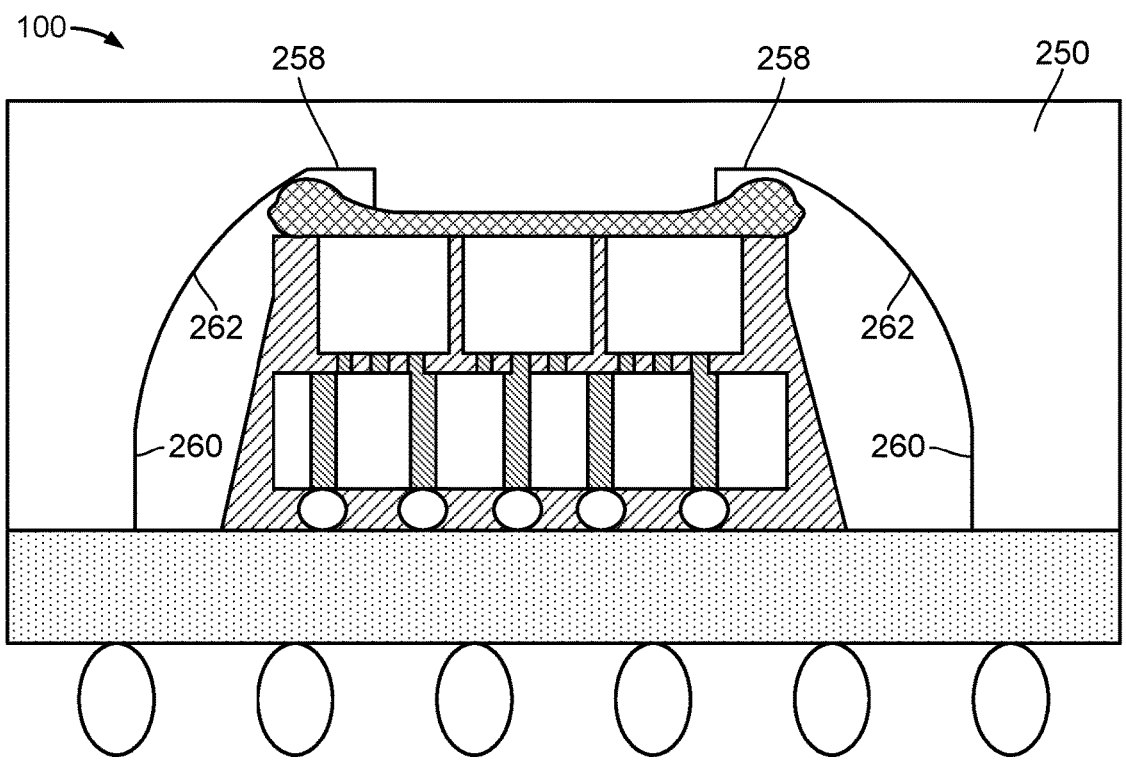
Figure 4C:
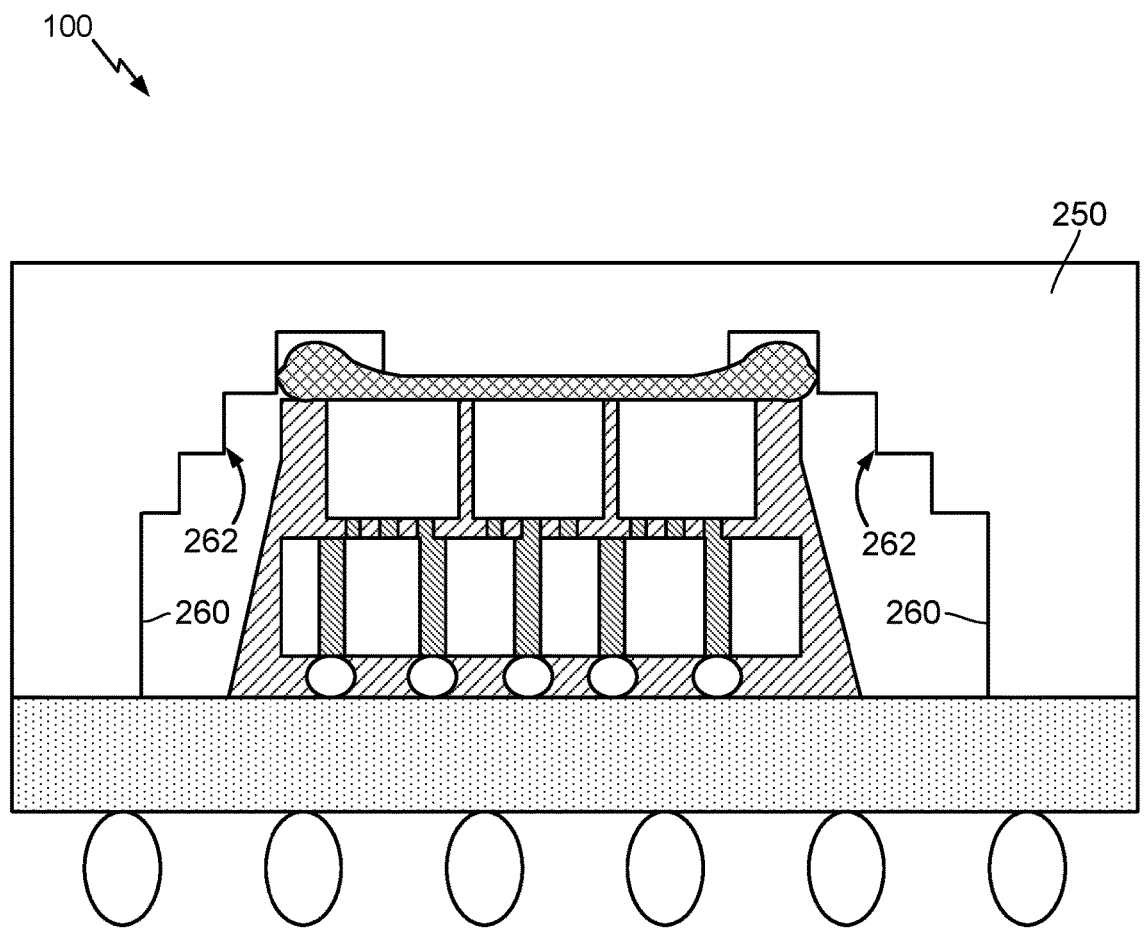

The fourth inner surface(s) 262 may have alternate or additional shapes to the horizontal surfaces illustrated in FIGS. 2 and 2A. For example, FIG. 4A portrays the fourth inner surfaces 262 being chamfered between the second and third inner surfaces 258, 260. As another example, FIG. 4B depicts the fourth inner surfaces 262 being curved (e.g., parabolic) between the second and third inner surfaces 258, 260. As yet another example, FIG. 4C shows the fourth inner surfaces having a step profile (e.g., like a staircase).

Example Operations for Fabricating an IC Package

Figure 5:
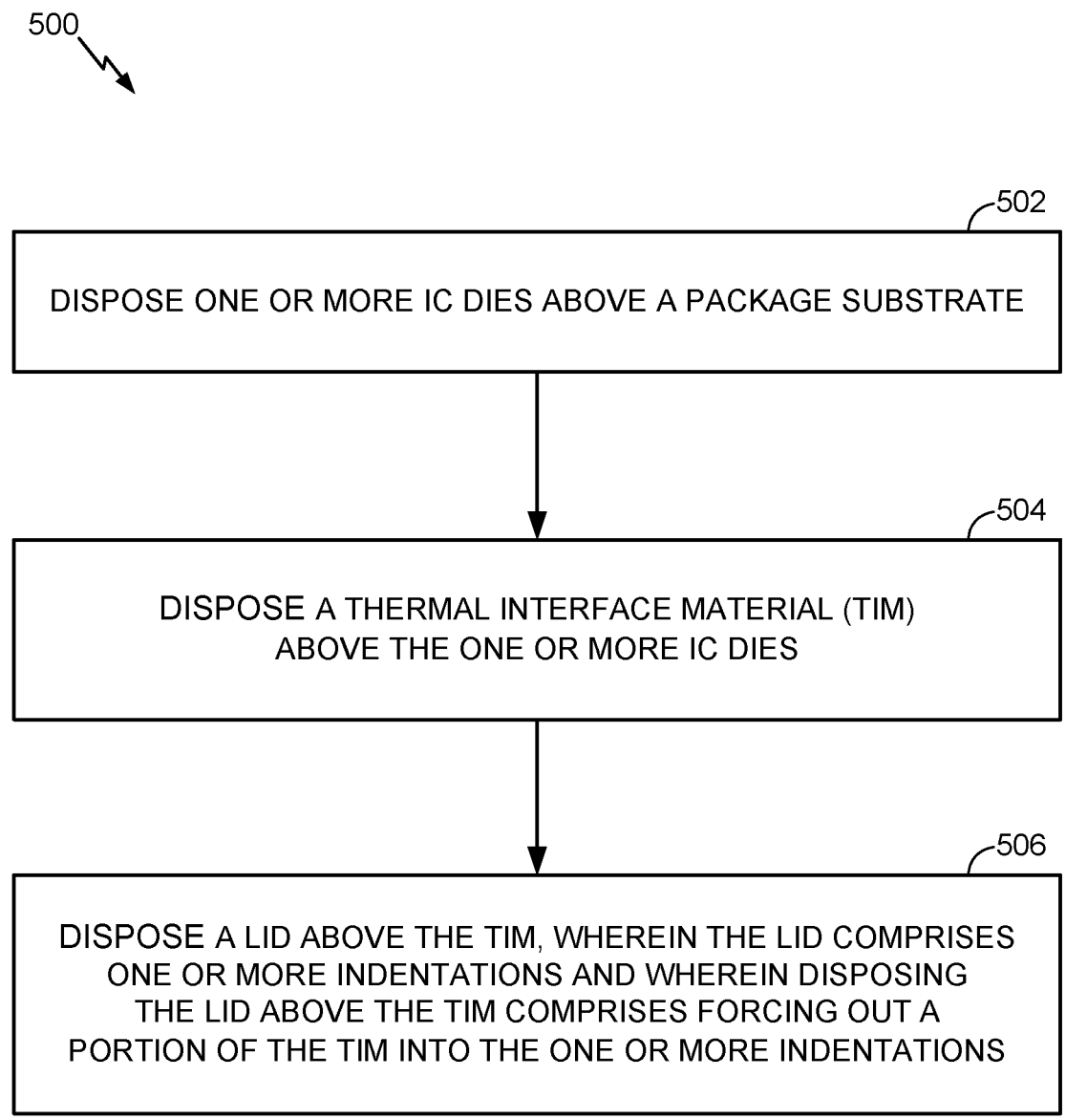
FIG. 5 is a flow diagram of example operations for fabricating an IC package with a lid, in accordance with an example of the present disclosure.

FIG. 5 is a flow diagram of example operations 500 for fabricating an IC package, in accordance with an example of the present disclosure. The operations 500 may begin, at block 502, by disposing one or more IC dies (e.g., dies 114) above a package substrate (e.g., substrate 122). At block 504, a TIM (e.g., TIM 140) is disposed above the one or more IC dies. At block 506, a lid (e.g., lid 250) is disposed above the TIM. The lid includes one or more indentations (e.g., recessed areas 256, which may also be referred to as trenches). Disposing the lid above the TIM at block 506 entails forcing out a portion of the TIM into the one or more indentations.

According to some examples, the lid further includes an outer surface (e.g., outer surface 252), a first inner surface (surface 254), and one or more second inner surfaces (e.g., surfaces 258) recessed from the first inner surface to form the one or more indentations in the lid. The first inner surface may be on an opposite side of the lid from the outer surface. For some examples, the TIM is thicker in areas underneath the indentations than in a region between the one or more IC dies and the first inner surface of the lid. For some examples, the lid also includes one or more third inner surfaces (e.g., surfaces 260) and one or more fourth inner surfaces (e.g., surfaces 262), wherein each fourth inner surface couples one of the second inner surfaces to one of the third inner surfaces. In some examples, the one or more third inner surfaces may be perpendicular to the first inner surface, whereas in other examples, the one or more third surfaces may be angled at other than 90° with respect to the first inner surface (e.g., trapezoidally). For some examples, at least one of the fourth inner surfaces is a chamfered surface (e.g., as illustrated in FIG. 4A). For other examples, at least one of the fourth inner surfaces is a curved surface (e.g., as shown in FIG. 4B) or has a stepped profile (e.g., as depicted in FIG. 4C).

According to some examples, disposing the lid above the TIM at block 506 involves disposing the lid such that the one or more indentations are located above one or more corners of the one or more IC dies.

According to some examples, the one or more indentations comprise four indentations. For some examples, the four indentations are disposed in a rectangular arrangement.

According to some examples, each of one or more locations of the lid includes a plurality of the indentations in the lid (e.g., as shown in FIG. 2A).

According to some examples, the operations 500 may further involve disposing a heat sink assembly (e.g., heat sink assembly 180) above the lid. The heat sink assembly may include, for example, a vapor chamber or a heat pipe.

Example Structures for TIM Adhesion Enhancement

As presented above, reduced TIM BLT may be desired to achieve lower thermal resistance. However, TIM BLT reduction may be limited by several factors, such as the maximum filler size, interfacial adhesion strength, topology absorption, and warpage compensation. For example, a certain TIM thickness may be specified in an effort to compensate for die curvature change during thermal steps and ensure good interfacial adhesion is maintained. If these factors are not taken into account in design and process development, TIM delamination can occur. TIM delamination can create voids with air (or potentially other gases) to be trapped therein, which reduce the thermal conductivity between the IC die(s) and the lid.

Examples of the present disclosure provide recessed areas in the backside surface(s) of the IC die(s) and/or in a molding for encapsulating and protecting the IC die(s). The recessed areas provide receptacles for accepting a portion of the TIM that may be laterally squeezed out when the lid is positioned on the TIM above the IC die(s). Such recessed areas may prevent sudden TIM squeeze-out and may provide anchoring points to enhance interfacial adhesion. Accordingly, TIM BLT reduction can be achieved between the lid and the IC die(s), but suitable interfacial adhesion is provided for the IC package with such receptacles. In this manner, the design can provide lower thermal resistance, increased thermal conductivity, and increased heat transfer from the IC die(s) to the lid.

Figure 6:
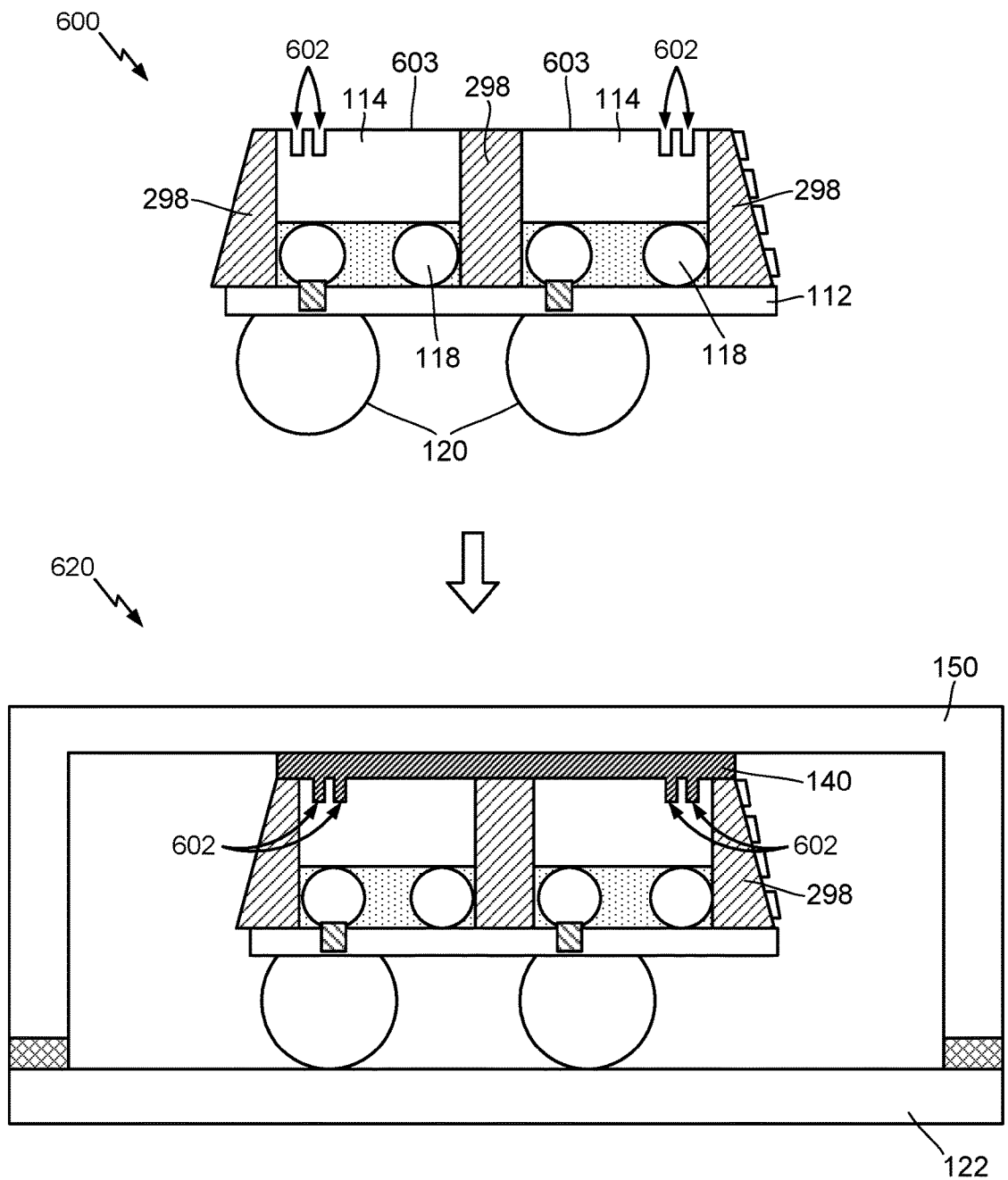
FIG. 6 illustrates cross-sectional views of an assembly during operations for fabricating an example IC package in which backside surfaces of the IC dies include recessed areas at IC die corners to accept a TIM, in accordance with an example of the present disclosure.

FIG. 6 illustrates a cross-sectional view of a pre-assembly 600 during one stage of operations for fabricating an example IC package 100, in accordance with an example of the present disclosure. The pre-assembly 600 includes one or more IC dies 114, an interposer 112, microbumps 118 for connecting the one or more dies 114 to the interposer 112, and package bumps 120 for connecting the interposer to a package substrate 122, which are described above. Although two IC dies 114 are shown in FIG. 6, the number of IC dies may range from one to as many as can be fit within the IC package.

The pre-assembly 600 includes one or more recessed areas 602, which are recessed with respect to the backside surfaces 603 of the IC dies 114. The backside surfaces 603 are the upper surfaces of the IC dies 114 when oriented in a flip-chip configuration, as shown in FIG. 6. Like the recessed areas 256, the recessed areas 602 may also be referred to by any of various other suitable names, such as trenches, indentations, receptacles, or cavities. The recessed areas 602 may be formed in the IC dies 114 by employing any suitable technique for removing a relatively narrow portion of the die material, such as etching (e.g., laser etching). As an example, the recessed areas 602 may be 5 μm wide and 10 μm deep, with a 180 μm pitch. Although only two recessed areas 602 are illustrated at the corners of the IC dies 114 in FIG. 6, each location with recessed areas may include one or any number of multiple recessed areas. For instance, the pre-assembly 600 may include four recessed areas 602 at each of the four corners of an IC package (e.g., two recessed areas associated with one edge of a corner and another two recessed areas associated with the other edge of the same corner). This is represented by the cross-sectional view of the pre-assembly 600 in FIG. 6, if considered as one of four sides of the IC package.

FIG. 6 also illustrates a cross-sectional view of another pre-assembly 650 during a subsequent stage of the operations for fabricating an example IC package 100, in accordance with an example of the present disclosure. In the pre-assembly 650, the pre-assembly 600 has been disposed above and connected with a package substrate 122 via the package bumps 120. In addition, a TIM 140 has been added above the backside surfaces 603 of the IC dies 114, and a lid (e.g., lid 150 or lid 250) has been disposed above the TIM 140 and coupled to the package substrate 122.

The recessed areas 602 are intended to receive a portion of the TIM 140 that is forced out (e.g., squeezed out) from above the IC die(s) 114 when the lid is positioned above the TIM. In this manner, the recessed areas 602 may act as a stop to prevent sudden TIM squeeze-out. In other words, recessed areas 602 (e.g., located at corners of the IC package) may retard TIM squeeze-out and encourage fillet formation. Because the recessed areas 602 accept at least a portion of the TIM 140, the TIM is thicker (i.e., the TIM BLT is greater) in these areas. Thus, the recessed areas 602 may also provide anchoring points to enhance TIM adhesion to the backside surface(s) 603 of the IC die(s) 114. Consequently, the BLT of the TIM 140 in the area between the lid and the IC die(s) can be reduced, compared to IC dies without one or more recessed areas 602. The reduced TIM BLT in this area provides comparatively lower thermal resistance, which improves heat dissipation of the IC die(s) 114 in the IC package 100.

Figure 7:
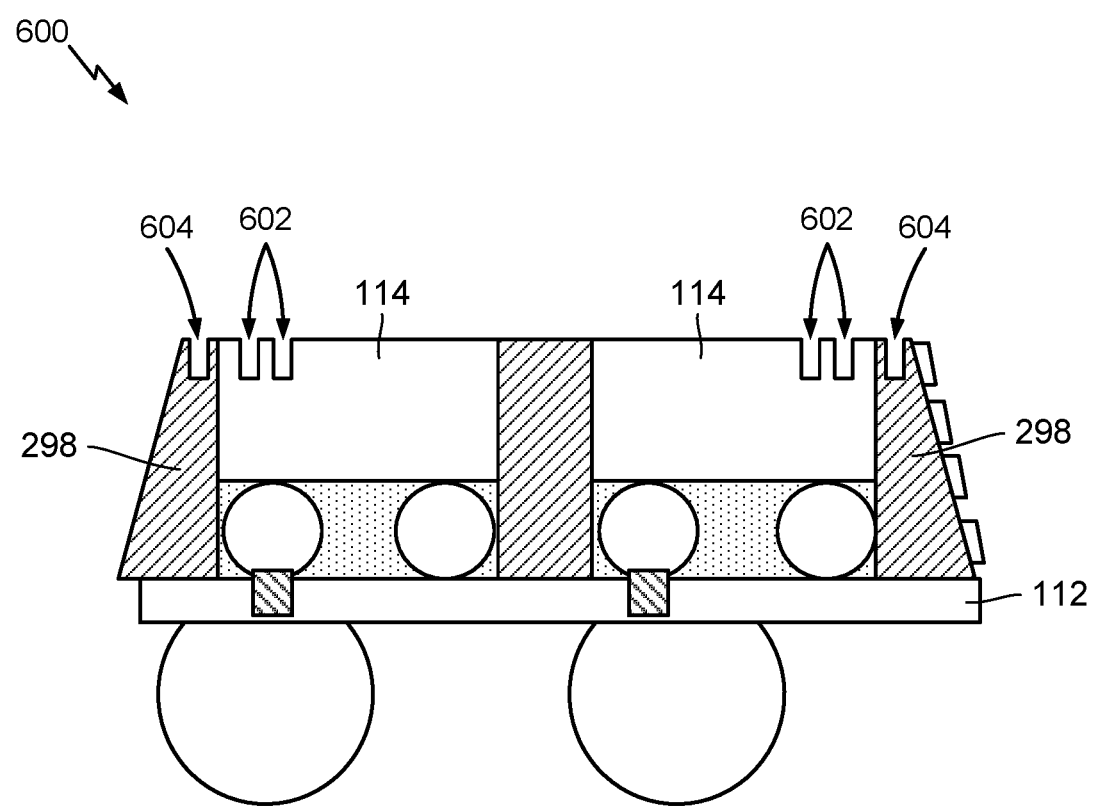
FIG. 7 is a cross-sectional view of an example assembly during fabrication of an IC package in which both the molding and the backside surfaces of the IC dies include recessed areas to accept a TIM, in accordance with an example of the present disclosure.

For some examples, the molding 298 may additionally or alternatively include one or more recessed areas 604. FIG. 7 is a cross-sectional view of the pre-assembly 600 during fabrication of an IC package in which both the backside surfaces 603 and the molding 298 of the IC dies 114 include recessed areas 602, 604 to accept a TIM 140, in accordance with an example of the present disclosure. For some examples, the recessed areas 604 may be similar in dimension to the recessed areas 602. The recessed areas 604 may be formed via any suitable techniques for removing portions of the molding 298, such as etching (e.g., laser etching).

Although only one recessed areas 604 is illustrated at an individual corner of an IC die 114 in FIG. 7, each location with recessed areas 602 and/or 604 may include one or any number of multiple recessed areas 602 and/or 604. For instance, the pre-assembly 600 in FIG. 7 may include four recessed areas 602 and one recessed area 604 at each of the four corners of an IC package (e.g., two recessed areas 602 associated with one edge of a corner, another two recessed areas 602 associated with the other edge of the same corner, and one recessed area 604 associated with the same corner). This is represented by the cross-sectional view of the pre-assembly 600 in FIG. 7, if considered as one of four sides of the IC package.

For some examples, an IC package may include one or more recessed areas 602 and a lid having one or more recessed areas 256, as described above. For some examples, the IC package may also include one or more recessed areas 604.

Example Operations for Fabricating an IC Package

Figure 8:
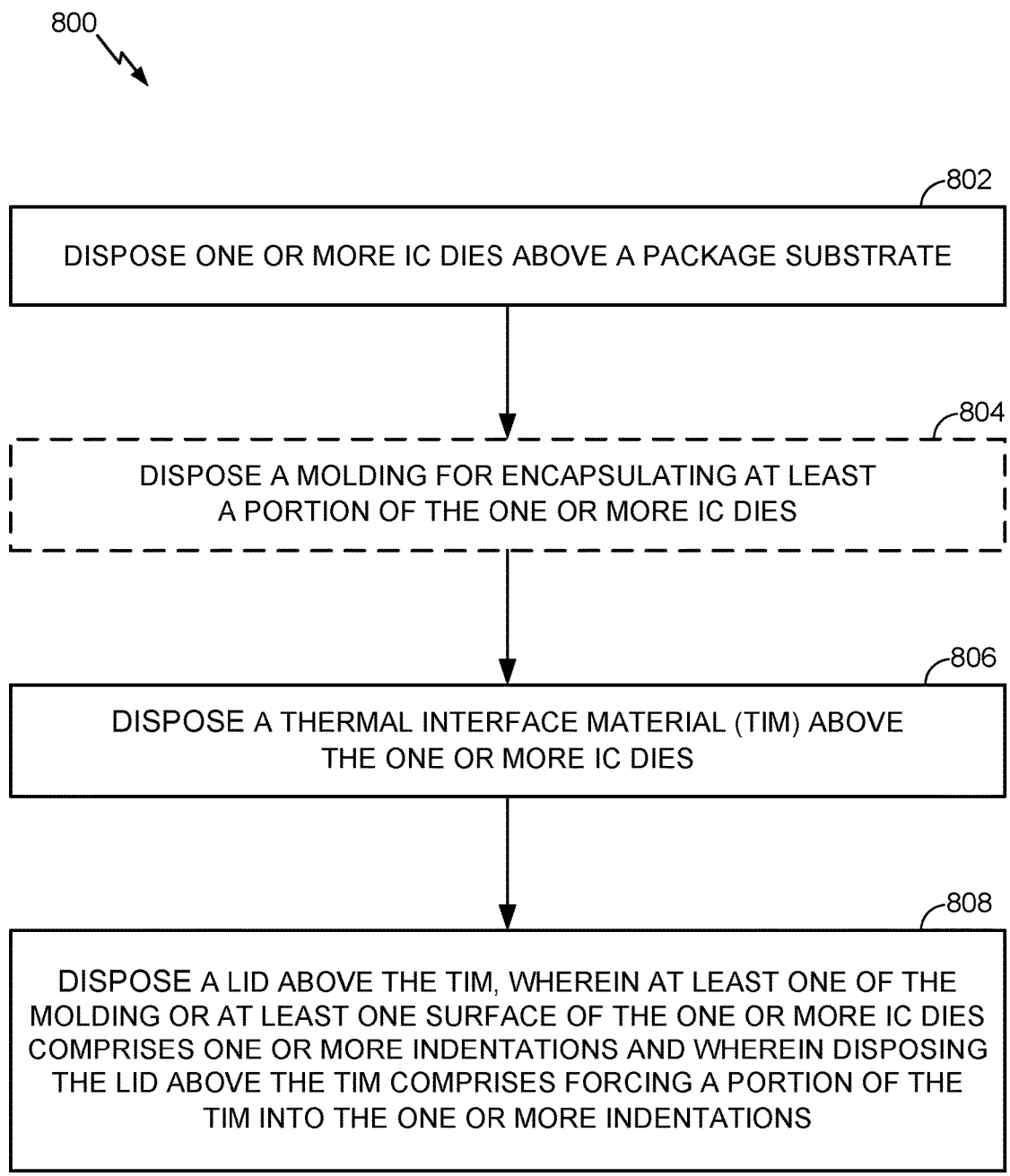
FIG. 8 is a flow diagram of example operations for fabricating an IC package with a lid, in accordance with an example of the present disclosure.

FIG. 8 is a flow diagram of example operations 800 for fabricating an IC package, in accordance with an example of the present disclosure. The operations 800 may begin, at block 802, by disposing one or more IC dies (e.g., dies 114) above a package substrate (e.g., substrate 122). At optional block 804, a molding (e.g., molding 298) for encapsulating at least a portion of the one or more dies may be disposed. At block 806, a TIM (e.g., TIM 140) is disposed above the one or more IC dies. At block 808, a lid (e.g., lid 250) is disposed above the TIM. At least one of the molding or at least one surface of the one or more IC dies includes one or more indentations (e.g., recessed areas 602 and/or 604, which may also be referred to as trenches). Disposing the lid above the TIM at block 808 entails forcing a portion of the TIM into the one or more indentations.

According to some examples, the one or more indentations are located adjacent one or more corners of the one or more IC dies.

According to some examples, the one or more indentations comprise twenty indentations. For some examples, the twenty indentations are disposed in a rectangular arrangement. For some examples, the twenty indications are located adjacent four corner regions of the one or more IC dies. In this case, the twenty indications include, for each of the four corner regions, one indentation in the molding, two indentations corresponding to one edge of the corner region, and two indentations corresponding to another edge of the same corner region.

According to some examples, the one or more indentations are formed in the molding or the at least one surface of the one or more IC dies by laser etching.

According to some examples, the lid includes one or more other indentations (e.g., recessed areas 256). For some examples, each of one or more locations of the lid includes a plurality of the indentations in the lid (e.g., as shown in FIG. 2A).

According to some examples, the operations 800 may further involve disposing a heat sink assembly (e.g., heat sink assembly 180) above the lid. The heat sink assembly may include, for example, a vapor chamber or a heat pipe.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:

1. An integrated circuit (IC) package, comprising:
one or more IC dies having backside recessed areas; and
a lid including:
an outer surface;
a first inner surface; and
one or more second inner surfaces recessed from the first inner surface to form one or more indentations in the lid, wherein at least one of the indentations is configured to extend beyond a boundary surrounding lateral surfaces of the one or more IC dies, the at least one of the indentations being configured to stretch across a vertical projection of an edge of the boundary.

2. The IC package of claim 1, wherein the one or more indentations comprise four indentations.

3. The IC package of claim 2, wherein the four indentations are disposed in a rectangular arrangement.

4. The IC package of claim 1, wherein each of one or more locations of the lid includes a plurality of the indentations in the lid.

5. The IC package of claim 1, further comprising:
one or more third inner surfaces; and
one or more fourth inner surfaces, each fourth inner surface coupling one of the second inner surfaces to one of the third inner surfaces.

6. The SIC package of claim 5, wherein at least one of the fourth inner surfaces is a chamfered surface.

7. The IC package of claim 5, wherein at least one of the fourth inner surfaces is a curved surface.

8. The IC package of claim 5, wherein at least one of the fourth inner surfaces has a stepped profile.

9. An integrated circuit (IC) package comprising:
a package substrate;
one or more IC dies disposed above the package substrate, the one or more IC dies having backside recessed areas;
a thermal interface material (TIM) disposed above the IC dies; and
a lid disposed above the TIM and comprising:
an outer surface;
a first inner surface; and
one or more second inner surfaces recessed from the first inner surface to form one or more indentations in the lid, wherein the one or more indentations are configured to extend beyond a boundary surrounding lateral surfaces of the one or more IC dies and wherein at least one of the indentations is configured to stretch across a vertical projection of an edge of the boundary.

10. The IC package of claim 9, wherein the TIM is thicker in areas underneath the one or more indentations than in a region between the one or more IC dies and the first inner surface of the lid.

11. The IC package of claim 9, wherein the one or more indentations are configured to receive a portion of the TIM that is forced out from between one or more upper surfaces of the one or more IC dies and the first inner surface of the lid.

12. The IC package of claim 9, wherein the one or more indentations are located above one or more corners of the one or more IC dies.

13. The IC package of claim 9, wherein the lid further comprises:
one or more third inner surfaces; and
one or more fourth inner surfaces, each fourth inner surface coupling one of the second inner surfaces to one of the third inner surfaces.

14. The IC package of claim 13, wherein at least one of the fourth inner surfaces is a chamfered surface.

15. The IC package of claim 13, wherein at least one of the fourth inner surfaces is a curved surface.

16. The IC package of claim 9, further comprising a heat sink assembly disposed above the lid.

17. The IC package of claim 9, wherein the at least one of the indentations is configured to stretch across the vertical projection of the edge of the boundary such that the at least one of the indentations is disposed both above a first area disposed inside the boundary and above a second area disposed outside the boundary.

18. The IC package of claim 9, wherein the one or more indentations are located only in one or more corners of the boundary surrounding the lateral surfaces of the one or more IC dies.

19. The IC package of claim 18, wherein the boundary is rectangular and wherein the one or more indentations comprise one indentation located in each of the four corners of the rectangular boundary.

20. The IC package of claim 9, wherein the TIM is disposed in the at least one of the indentations configured to stretch across the vertical projection of the edge of the boundary.

* * * * *

UNITED STATES PATENT AND TRADEMARK OFFICE
CERTIFICATE OF CORRECTION

PATENT NO. : 10,529,645 B2
APPLICATION NO. : 15/617774
DATED : January 7, 2020
INVENTOR(S) : Jaspreet Singh Gandhi et al.

Page 1 of 1

It is certified that error appears in the above-identified patent and that said Letters Patent is hereby corrected as shown below:

In the Claims

Column 11 Line 36 In the Claim 6, delete "SIC" and insert -- IC --, therefor.

Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*